United States Patent [19]

Dickie

[11] Patent Number: 4,690,244

[45] Date of Patent: Sep. 1, 1987

[54] LOUDSPEAKER ENCLOSURES

[75] Inventor: Laurence G. Dickie, Brighton, England

[73] Assignee: B & W Loudspeakers Limited, Brighton, England

[21] Appl. No.: 826,910

[22] Filed: Feb. 6, 1986

[30] Foreign Application Priority Data

Feb. 9, 1985 [GB] United Kingdom ................. 8503389

[51] Int. Cl.[4] ................................................ H05K 5/00

[52] U.S. Cl. ...................................... 181/146; 181/199

[58] Field of Search ............... 181/148, 151, 152, 156, 181/199, 146

[56] References Cited

U.S. PATENT DOCUMENTS

| | | | |
|---|---|---|---|
| 2,031,500 | 2/1936 | Olney | 181/151 |
| 2,866,514 | 12/1958 | Weathers | 181/151 |
| 3,696,886 | 10/1972 | Armstrong | 181/156 |
| 3,953,675 | 4/1976 | Babb | 181/148 X |
| 4,054,748 | 10/1977 | Balogh | 381/155 |

FOREIGN PATENT DOCUMENTS

| | | | |
|---|---|---|---|
| 483745 | 4/1938 | United Kingdom | 181/151 |
| 793193 | 4/1958 | United Kingdom . | |

*Primary Examiner*—Benjamin R. Fuller

*Attorney, Agent, or Firm*—Merchant, Gould, Smith, Edell, Welter & Schmidt

[57] ABSTRACT

A loudspeaker enclosure comprises a rectangular box-like housing (100) consisting of top (102) and bottom walls (104), front and back walls (106), left (108) and right (110) side walls, each of the walls being formed by a wooden panel, a hollow stiffening structure (200) located within the housing (100) and extending from the top wall (102) to the bottom wall (104), from the front wall to the back wall (106), and from the left side wall (108) to the right side wall (110), the hollow stiffening structure (200) comprising a first set of spaced-apart stiffening panels (1,2,3) arranged with their planes substantially parallel to each other and substantially parallel to the walls of a pair (102, 104) of opposed housing walls, and a second set of spaced-apart stiffening panels (4,5) arranged with their planes substantially parallel to each other and substantially parallel to the walls of a different pair (108, 110) of opposed housing walls, the stiffening panels (1,2,3) of the first set being secured to stiffening panels (4,5) of the second pg,2 set and intersecting the substantially orthogonally so that the stiffening panels, together with the housing walls define a multiplicity of rectangular parallelepipedal cells (250), holes (13,23,33,43,53) being provided in the stiffening panels to provide communication between adjacent cells.

25 Claims, 10 Drawing Figures

LOUDSPEAKER ENCLOSURES

The invention relates to loudspeaker enclosures.

The sound output from a loudspeaker system includes, in addition to the sound from the loudspeaker drive unit or units, sound resulting from vibration of the walls of the enclosure. The enclosure will inevitably have resonance frequencies, with the result that the intensity of the sound resulting from vibration of the walls of the enclosure will be greater at some frequencies than at others, thus causing coloration of the sound output.

Reducing the coloration entails reducing the amplitude of vibration of the enclosure walls for a given level of excitation, which amplitude is determined at low frequencies primarily by the stiffness of the enclosure and at high frequencies primarily by the mass per unit area of the walls. Conventional loudspeakers have quite thick wooden walls with a view to providing reasonable stiffness and a high mass per unit area. While the high mass per unit area has the advantage of reducing the vibration amplitude at high frequencies, it does have two significant disadvantages, which both stem from the fact that the enclosure walls constitute a resonant system.

The first disadvantage of increasing the mass per unit area of the enclosure walls is that the Q-factor is increased, which implies a longer "reverberation time". By analogy with the quantity used in room acoustics, the reverberation time of a loudspeaker enclosure may be defined as the time taken, after excitation has ceased, for the amplitude of vibration of the walls to decay by 60 dB. With that definition, a reverberation time of up to 0.3 second is not unusual for a conventional enclosure having wooden walls.

The second disadvantage of increasing the mass per unit area of the enclosure walls is that the resonance frequencies are lowered. Considering first a loudspeaker enclosure having only a single drive unit, the amplitude of variation of the air pressure within the enclosure decreases as the frequency of vibration of the drive unit increases. Accordingly, the walls are "driven" harder at lower frequencies, with the result that lower frequency resonances are more serious than higher frequency resonances. In the case of a loudspeaker enclosure having two or more drive units to which signals are supplied through a so-called crossover network which is such that (taking for simplicity the case where there are just two drive units) low frequency signals go only or primarily to one drive unit (commonly referred to as a "woofer") and high frequency signals go only or primarily to the other drive unit (commonly referred to as a "tweeter"), there is an additional factor in that a tweeter has an enclosure that ensures that the air adjacent to the rear face of the tweeter diaphragm is not in communication with the air in the main part of the enclosure. Thus, at the frequencies that are handled substantially only by the tweeter, which are commonly the frequencies above 3 kHz, the walls of the enclosure are not driven to any signficant extent.

In accordance with the analysis set out above, it has been proposed to use as the material of construction of loudspeaker enclosure walls a material in the form of two thin sheets of aluminium separated by, for example, an aluminium alloy honeycomb structure. Such a material has a high stiffness-to-mass ratio, which leads to higher resonance frequencies than those of a conventional wooden cabinet. If one assumes that the Q-factor remains constant, then a higher resonance frequency implies a shorter reverberation time, because the Q-factor is inversely proportional to the percentage loss per cycle of the energy of the system that stems from its vibration, and at higher frequencies there are more cycles per unit time and hence a higher proportion of the energy of vibration is lost per unit time. In fact, the increased stiffness-to-mass ratio of the walls also increases the Q-factor but to an extent that only partially offsets the decrease in reverberation time that stems from the higher resonance frequencies. Accordingly, the net effect of the increased stiffnes-to-mass ratio of the walls is to shorten the reverberation time of the enclosure. A difficulty arises, however, because of the so-called coincidence effect.

The theory underlying the coincidence effect is somewhat complicated, and it is convenient to consider the effect in terms of the transmissibility of the enclosed walls to sound generated within the enclosure by the rear face of the drive unit (rather than in terms of the vibration of the walls). The coincidence effect, which is not a simple resonance phenomenon (in that it does not occur at only a single frequency), manifests itself as an increase in the transmissibility of the walls to sound having frequencies above a certain critical frequency.

The critical frequency is directly proportional to the square root of the mass per unit area of the walls and inversely proportional to a quantity that is a measure of the flexural stiffness of the walls. Thus, with walls having a low stiffness-to-mass ratio the critical frequency is low and the coincidence effect becomes a serious disadvantage. Accordingly, it has been proposed to fill a loudspeaker enclosure having such walls at least partially with a sound-absorbing material, in order to reduce the amplitude of the sound waves incident on the inner surfaces of the walls.

The Applicants have carried out experiments to investigate the coloration produced by vibration of the walls of loudspeaker enclosures. The experiments were designed to measure the level of the sound from the casing walls, both absolutely for a given input signal and in relation to the level of the sound from the drive unit or units, to measure the reverberation time of the enclosure, and to ascertain the subjective effect of different levels of sound from the casing walls and of different reverberation times. A brief outline of the experimental procedures follows.

Loudspeaker enclosures of a variety of different constructions were each subjected to a series of tests. In the first test, the loudspeaker was placed in a reverberant room, and the total sound from the loudspeaker system, that is to say, the sound from the drive unit or units, and the sound from the enclosure walls, was picked up by a microphone in the room. The signal fed to the loudspeaker was pink noise (random noise having equal energy per octave over the frequency band under investigation), and the output from the microphone was fed to a spectrum analyser.

That experiment was then repeated, but with the loudspeaker enclosure having sealed to it, over and in register with its front face, an enclosure that was indentical to the loudspeaker enclosure except that the the drive unit or units had been removed. The output from the spectrum analyser was then representative of the sound emitted by the walls of the resulting double casing only, and the level of that sound was a good approximation to the level of the sound produced by the vibration of the walls of the original loudspeaker enclosure only, and thus the level of that sound, both in relation to the strength of the signal fed to the loudspeaker and in relation to the level of the sound from the drive unit or units, could be ascertained.

The loudspeaker enclosure with the drive unit or units masked by the second enclosure as described above, and not the original loudspeaker system, was used for the remaining tests.

In the second test, the "masked" loudspeaker was placed in an anechoic room with a microphone, a signal representative of a burst of sound was fed to the loudspeaker, and the decay of the output signal from the microphone was examined to ascertain the reverberation time of the 'masked' loudspeaker, which can be shown to be a good approximation to the reverberation time of the walls of the original loudspeaker enclosure.

In the third test, the loudspeaker was again placed in an anechoic room together with a microphone and a music signal, for example, from a compact disc player, was fed to the loudspeaker. The same signal was also fed to headphones worn by a listener outside the room. The output from the microphone was mixed, at a level that was below the level of the original signal to an extent determined by the first test, with the original signal being fed to the headphones. The level at which the signal from the microphone was mixed in could of course be varied above or below what could be regarded as the correct level, that is to say, the level as determined in the first test, and the signal from the microphone could also be switched in and out.

The experiments not only confirmed the desirability of having a low level of sound output for the walls of the casing, and of having a short reverberation time, but showed that the maximum sound level from the enclosure walls that was acceptable, in that it did not materially impair the subjective effect experienced by the listener, increased as the reverberation time decreased.

The present invention provides a loudspeaker enclosure comprising a rectangular box-like housing consisting of top and bottom walls, front and back walls, left and right side walls, each of the walls being formed by a wooden panel, a hollow stiffening structure located within the housing and extending from the top wall to the bottom wall, from the front wall to the back wall, and from the left side wall to the right side wall, the hollow stiffening structure comprising a first set of spaced-apart stiffening panels arranged with their planes substantially parallel to each other and substantially parallel to the walls of a pair of opposed housing walls, and a second set of spaced-apart stiffening panels arranged with their planes substantially parallel to each other and substantially parallel to the walls of a different pair of opposed housing walls, the stiffening panels of the first set being secured to the stiffening panels of the second set and intersecting them substantially orthogonally so that the stiffening panels, together with the housing walls define a multiplicity of rectangular parallepipedal cells, holes being provided in the stiffening panels to provide communication between adjacent cells.

As compared with a conventional loudspeaker enclosure having wooden walls, it would be expected, on the basis of the analysis given above and the results of the Applicants' experiments described above, that the stiffening panels of the loudspeaker enclosure according to the invention might effect some reduction in the amplitude of vibration of the enclosure walls at low frequencies (below the lowest resonance frequency), but that in any event the improvement would be too insignificant to justify the increased complexity of construction, and that there would be little if any improvement in the subjective performance because of the long reverberation time that is to be expected when the enclosure walls are wooden panels that will inevitably have a relatively high mass per unit area. In particular, it would be expected that the subjective performance would be less good than that of the previously proposed metal sandwich construction referred to above, at least below the critical frequency of that enclosure. Surprisingly, experiments on the lines of those described above have shown that, not only do the stiffening panels reduce the amplitude of vibration of the enclosure walls at low frequencies, but they also materially reduce the reverberation time, with the result that the subjective performance is also materially improved. The reduction in the reverberation time indicates that the stiffening panels must significantly increase the damping, but the mechanism by which the damping is increased is not at present fully understood.

Advantageously, the stiffening panels of at least one of the said sets of stiffening panels are of integral construction and span the interior of the housing. Where the stiffening panels of one of the said sets of stiffening panels are of integral construction and span the interior of the housing then, the stiffening panels of the other of the said sets of stiffening panels are made up of strips of which some extend between, and are secured to, adjacent panels of the said one set and others extend between, and are secured to panels of the said one set and walls of the housing. The strips that make up a given stiffening panel do not need to be coplanar, although in practice they usually would be. Preferably, however, the stiffening panels of both of the said sets of stiffening panels are of integral construction and span the interior of the housing, each stiffening panel including slots, and the slots in the stiffening panels of each set receiving stiffening panels of the other set.

Advantageously, the stiffening panels of one set are secured to the stiffening panels of the other set. Preferably, the stiffening panels are so secured together by means of adhesive.

The stiffening panels are advantageously wooden, and are preferably made of hardboard. Plywood is another preferred material. The thickness of such wooden stiffening panels may vary depending on the size of the housing and on the spacing between adjacent panels of each set, but a thickness of from 2 to 6 millimetres will usually be found to be suitable.

Instead of using wooden stiffening panels, there may be used stiffening panels made of a plastics material, and then the hollow stiffening structure may be of integral construction. Thus, it may be formed by injection moulding.

Advantageously, the stiffening panels are secured to the housing walls. It will be appreciated that, when the stiffening panels are secured to the housing walls, they are in tension as well as in compression, with the result that their efficency is enhanced. The stiffening panels are advantageously secured to the housing walls by means of adhesive, and the adhesive used is preferably one that sets to a rubbery rather than a brittle condition. An adhesive of that type that has been found to be satisfactory is a polyvinyl acetate adhesive. The same considerations apply to the choice of adhesive used to secure wooden stiffening panels of one set to the wooden stiffening panels of the other set.

Although, as explained above, the mechanism by which the stiffening structure damps vibration of the housing wall, is not fully understood, it is believed that, where there is used, for the purposes indicated above, an adhesive that sets to a rubbery rather than a brittle condition, the adhesive may make a material contribution to the damping provided by the stiffening structure.

The stiffening structure and the inner surfaces of at least those housing walls, that are not designed to receive a drive unit or drive units may be sprayed with a sound-deadening substance that also serves as an adhesive that secures edge portions of the stiffening panels to walls of the housing and that, where the stiffening structure is not of integral construction, serves to secure the stiffening panels of one set to the stiffening panels of the other set. A bitumastic material may be found to be suitable for that purpose, and again it may contribute materially to the damping provided by the stiffening structure.

It will be appreciated that, for the sets of panels to serve as a stiffening structure, either they must be a tight fit within the housing, or edge portion of the panels must be secured to the housing walls. Further, at least as a general rule, the adhesives that will be found to operate satisfactorily with wooden stiffening panels will require wood-to-wood contact. In order to avoid the need for the tight tolerances that would otherwise be required to achieve that, edge portion of the stiffening panels may be received in grooves in the housing walls. Then, it is necessary only that the thickness of the stiffening panels be correctly related to the width of the grooves.

Advantageously, the cells defined by the stiffening panels, together with the housing walls, are of substantially square cross-section. Then, each housing wall is stiffened by the stiffening panels at substantially equal intervals in the two directions that are parallel to the two pairs of opposite edges of the wall.

Advantageously, each of the said sets of stiffening panels consists of at least three stiffening panels, and preferably one of the said sets consists of at least five stiffening panels. When going from a loudspeaker enclosures of a given size to one of a significantly larger size, it is possible to increase the number of stiffening panels employed and/or to increase their thickness.

Advantageously, at least some of the said cells contain acoustically absorbent material. Preferably, at least a majority of the cells contain such material, and it will often be found preferable to arrange that all the cells contain such material. The relevant considerations are explained below in the context of the loudspeaker systems described with reference to accompanying drawings. The acoustically absorbent material may be in the form of blocks of an open-cell plastics material, blocks of open-cell polyester foam or open-cell polyether foam being suitable. Instead, the acoustically absorbent material may be in the form of bonded acoustic fibre, waste wool, rock wool or fibreglass.

Advantageously the front wall of the loudspeaker enclosure is arranged to receive at least one loudspeaker drive unit, and the stiffening panels of one set lie parallel to the side walls of the housing, and the stiffening panels of the other set lie parallel to the top and bottom walls of the housing.

The housing walls are advantageously made of particle board, which is sometimes referred to as chipboard. It is a wooden material being made of particles, or chips of wood embedded in a resinous matrix, and it has a high density. A veneer on the outer surfaces of the walls is usual.

A suitable thickness for the wooden housing walls will usually be within the range of from 10 to 20 millimeters, and a suitable mass per unit area of the walls will usually be within the range of from 7 to 12 kilograms per square meter.

The invention also provides a loudspeaker enclosure in accordance with the invention, together with one or more loudspeaker drive units mounted in the wall of the housing. A wall of the housing having one or more loudspeaker drive units may also be provided with a vent so that the loudspeaker enclosure constitutes a Helmholtz resonator.

Two loudspeaker systems constructed in accordance with the invention will now be described, by way of example only, with reference to the accompanying drawing, in which.

The first loudspeaker system constructed in accordance with the invention comprises a loudspeaker enclosure and two loudspeaker drive units. The loudspeaker enclosure contains a plurality of intersecting stiffening panels forming a cellular structure. All of the cells contain acoustically absorbent material and holes in the panels provide communication between adjacent cells. The intersecting stiffening panels are formed from hardboard and each of the cells is of square cross-section as viewed in front elevation. The whole cellular structure is rigidly secured together by the use of adhesive at the intersections, and is also rigidly secured to the walls of the enclosure except where that is prevented by the loudspeaker drive units and a vent. Grooves are formed in the walls of the enclosure to receive the free edge portions of the cellular structure, and those edge portions are secured in the grooves by means of adhesive. A preferred adhesive for use in constructing the enclosure is a PVA (polyvinyl acetate) adhesive. The acoustically absorbent material is foamed synthetic resin material which is inserted in blocks into the individual cells.

Figure 1:
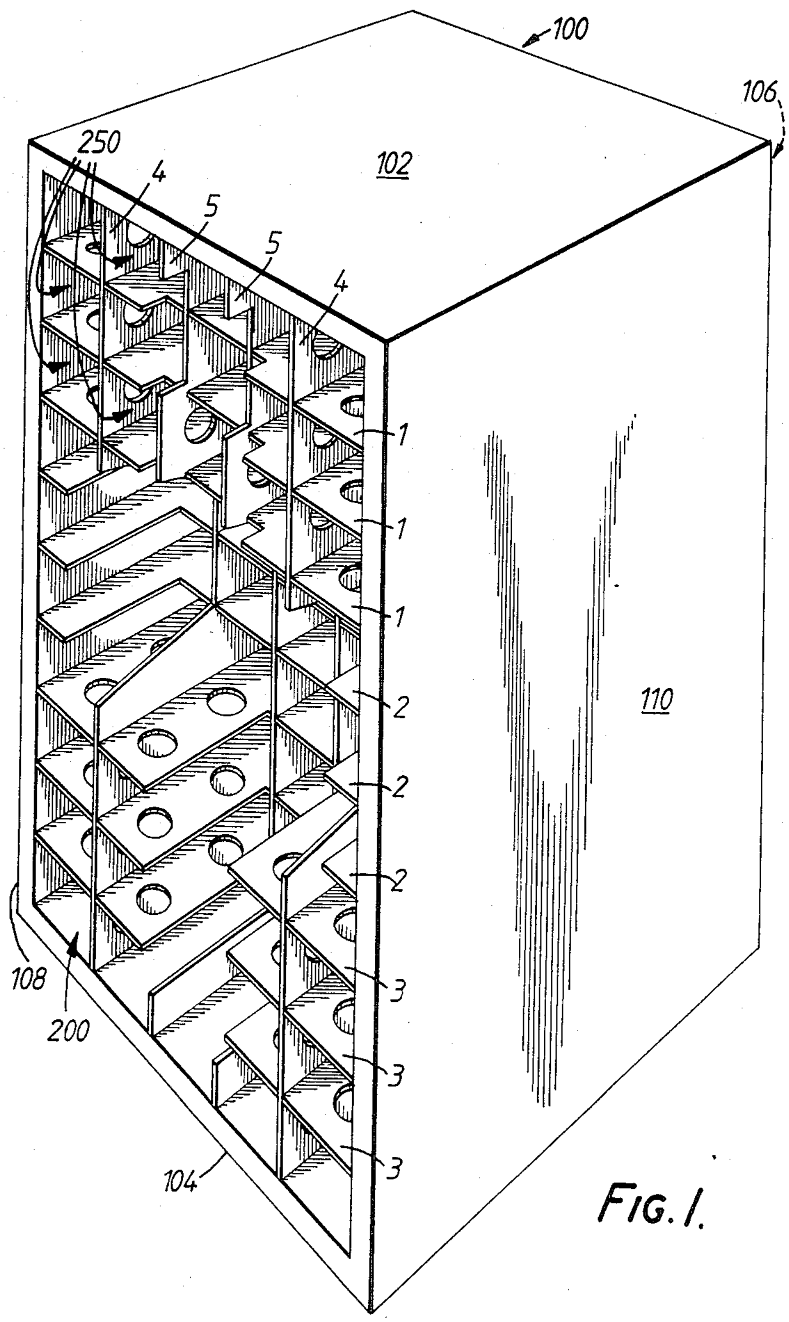
FIG. 1 is a schematic perspective view of the loudspeaker enclosure of the first system with the front wall removed.
Figure 2:
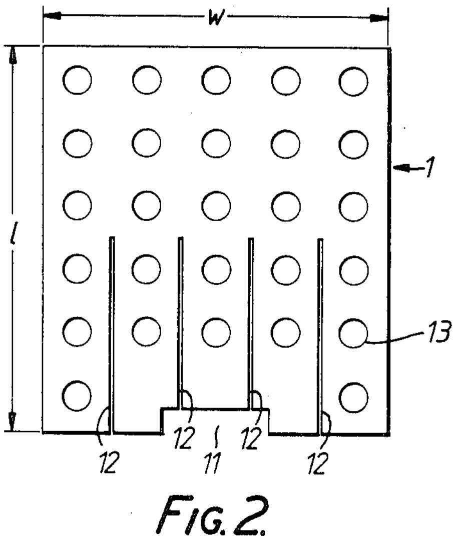
FIG. 2 is a plan view of a first form of stiffening panel used in the enclosure.

Referring to the drawings and FIG. 1 in particular, the loudspeaker enclosure comprises a rectangular box-like housing, which is indicated generally by the reference numeral 100 consisting of a top wall 102, a bottom wall 104, a front wall (not shown), a back wall 106, a left side wall 108 and a right side wall 110, each of the walls being a wooden panel. Each panel is approximately 15 millimeters thick, is veneered and has a mass per unit area of about 9 kilograms per square meter (including the veneer). The front wall is omitted from FIG. 1 in order to reveal the interior of the enclosure. A pair of loudspeaker drive units (not shown) are mounted on the front wall in conventional manner. The wooden walls that form the walls of the housing are made of chipboard.

Figure 9:
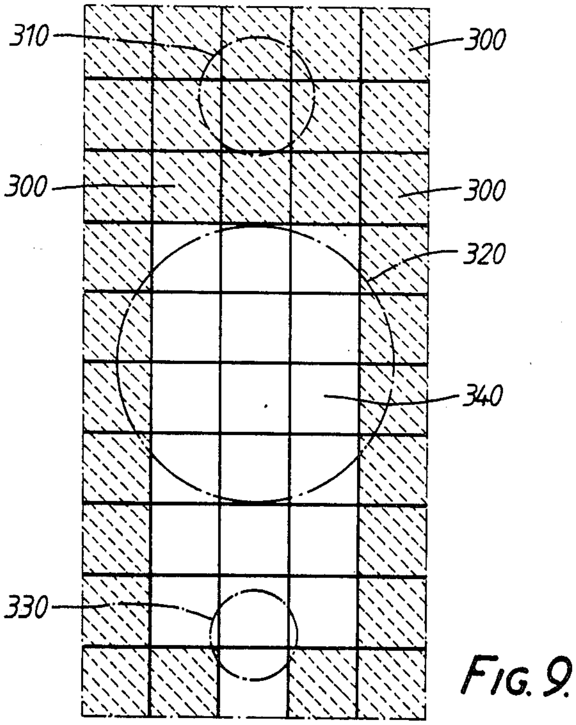
FIG. 9 is a schematic assembly drawing of the loudspeaker enclosure.

A hollow stiffening structure, which is indicated generally by the reference numeral 200, is located within the housing 100 whilst leaving room for the loudspeaker drive units and a free space in the vicinity of a circular vent (the position of which is indicated by the circle 330 in FIG. 9 and which is described in more detail below). The hollow stiffening structure 200 is secured in place by means of adhesive and rigidly connects the top wall 102 to the bottom wall 104, the front wall (not shown) to the back wall 106, and the left side wall 108 to the right side wall 110. The hollow stiffening structure 200 comprises a first set of nine spaced-apart stiffening panels consisting of three panels 1, three panels 2 and three panels 3 (which are described in more detail below) arranged with their planes parallel to each other and parallel to the top wall 102 and to the bottom wall 104 (so that with the loudspeaker system in its normal orientation they extend horizontally), and a second set of four spaced-apart stiffening panels consisting of two panels 4 and two panels 5 (which are described in more detail below) arranged with their planes parallel to each other and parallel to the left side wall 108 and to the right side wall 110 (so that with the loudspeaker system in its normal orientation they extend vertically) The horizontal stiffening panels 1, 2 and 3 of the first set intersect the vertical stiffening panels 4 and 5 of the second set and are rigidly secured thereto by the use of adhesive at the intersections. A multiplicity of rectangular parallepipedal cells 250 are created by this means. Circular holes (which are described in detail below) are provided in the stiffening panels to allow communication between adjacent cells, and all of the cells contain acoustically absorbent material (not shown in FIG. 1) as is described in detail below.

The shapes of the stiffening panels 1 to 5 are shown in FIGS. 2 to 6, respectively. The loudspeaker enclosure employs three stiffening panels 1 of the form shown in FIG. 2, three panels 2 of the form shown in FIG. 3, three stiffening panels 3 of the form shown in FIG. 4, two stiffening panels 4 of the form shown in FIG. 5 and two stiffening panels 5 of the form shown in FIG. 6. All the stiffening panels 1, 2, 3, 4, 5 are made of 3 millimeter thick hardboard.

Each stiffening panel 1 is generally rectangular in outline and has a length l of 255 millimeters and width w of 230 millimeters. One transverse edge of each stiffening panel 1 has a centrally-placed rectangular recess 11 of dimensions 15×73 millimeters and four slots 12 run parallel to each other and parallel to the longitudinal axis of the stiffening panel from that edge and end half-way along the length of the stiffening panel. The two outermost slots open into the said transverse edge and the two innermost slots open into the recess 11. Each slot is 3 millimeters wide and they are arranged symetrically about the longitudinal axis of the stiffening panel and have their axes pitched 46 millimeters apart. Each stiffening panel 1 includes twenty-seven circular apertures 13 of diameter 19 millimeters with centres pitched 42 millimeters apart longitudinally and 46 millimeters apart transversely and arranged in five columns. The arrangement of the apertures 13 is symmetrical about the transverse and longitudinal axes of the stiffening panel 1 except that, to avoid coming too close to the edge of the material, the three apertures adjacent to the recess 11 that a perfectly symmetrical arrangement would require are not in fact provided.

Figure 3:
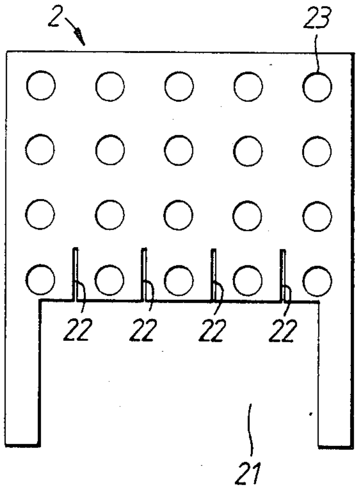
FIG. 3 is a plan view of a second form of stiffening panel used in the enclosure.

The stiffening panels 2, of which one is shown in FIG. 3, differ from the stiffening panels 1 only in that a much larger rectangular recess 21 is provided and in that only twenty apertures 23, arranged in five columns of four, are provided. The recess 21 has dimensions 90×186 millimeters and four slots 22 open into the recess. All other dimensions are the same as those given for the stiffening panel 1 and the material is again hardboard.

Figure 4:
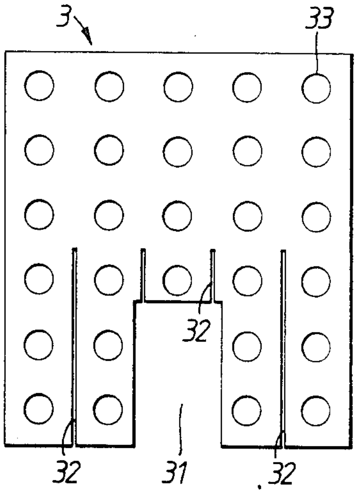
FIG. 4 is a plan view of a third form of stiffening panel used in the enclosure.
Figure 5:
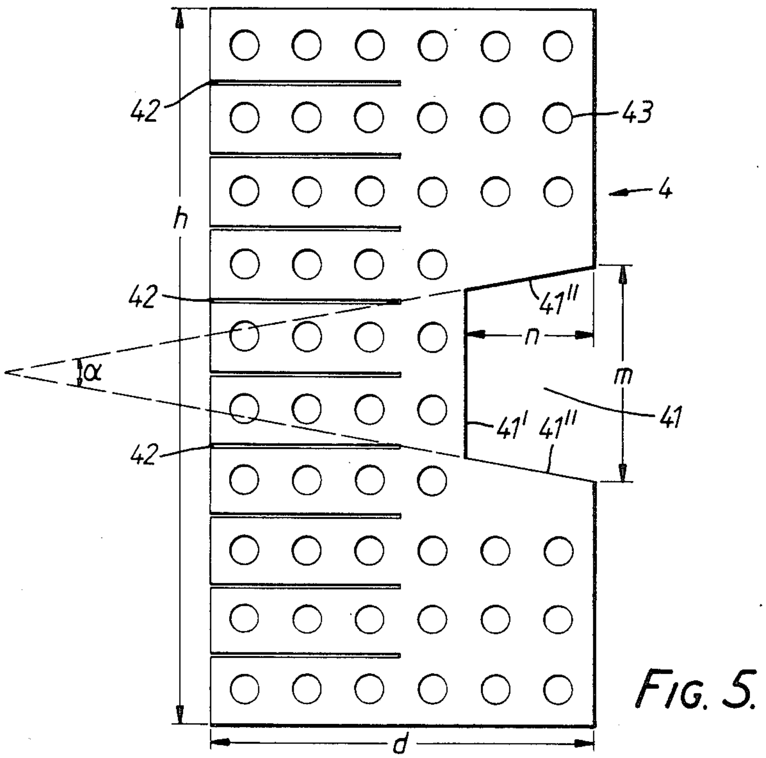
FIG. 5 is a side elevation of a fourth form of stiffening panel used in the enclosure.

The stiffening panels 3, of which one is shown in FIG. 4, differs from the stiffening panels 1 only in that a different size of rectangular recess 31 is provided and in that twenty-eight apertures 33 are provided. Four slots 32 are again provided and the dimensions are the same as those given for the panel 1 and the material is again hardboard.

The stiffening panels 1, 2 and 3 extend horizontally in the loudspeaker enclosure whereas the stiffening panels 4 and 5 extend vertically.

Each stiffening panel 4 (see FIG. 5) is generally rectangular in outline and has a height h of 450 millimeters and a depth d of 255 millimeters and is made of 3 millimeters thick hardboard. One of the long edges of each stiffening panel 4 has a symmetrical centrally-placed recess 41 and nine open-ended slots 42 run parallel to each other and parallel to the short edges of the stiffening panel inwardly from the other long edge of the panel. Each slot 42 has a length equal to one half of the depth of the stiffening panel 4. The recess 41 is trapezoidal in shape and has a rear wall 41' parallel to the longitudinal axis of the stiffening panel 4 and forming one of the parallel sides of the trapezium. The side walls 41'' of the trapezium diverge towards the said one edge of the stiffening panel 4, the angle of divergence $\alpha$ being 20°. The mouth of the recess 41 has a length m of 134 millimeters and the recess has a depth n of 90 millimeters. The stiffening panel 4 includes fifty-two circular apertures 43 of diameter 19 millimeters with centres pitched 45 millimeters apart longitudinally and 42 millimeters apart transversely. The arrangement of the apertures 43 is symmetrical about the transverse and longitudinal axes of the stiffening panel 4 except that the eight additional apertures required for perfect symmetry cannot be provided because of the presence of the recess 41. Each slot 42 is 3 millimeters wide and the axes of the slots are pitched 45 millimeters apart.

Figure 6:
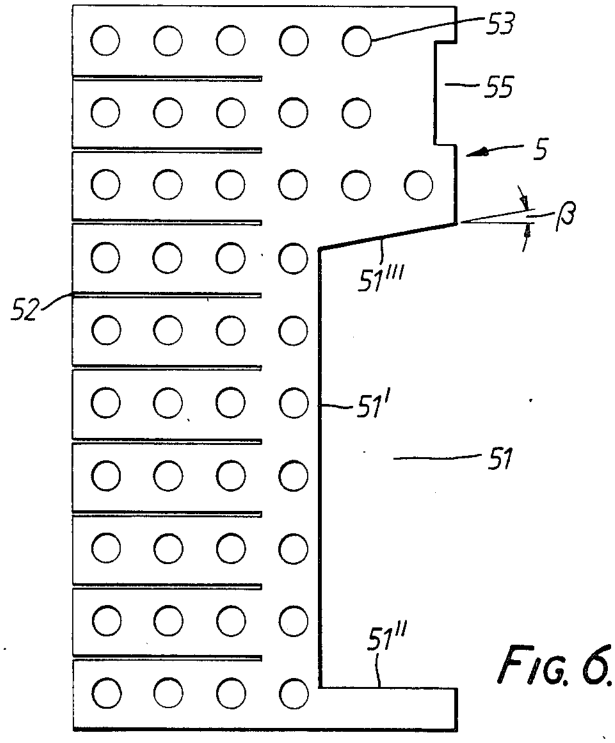
FIG. 6 is a side elevation of a fifth form of stiffening panel used in the enclosure.

The stiffening panels 5, of which one is shown in FIG. 6, differ from the panels 4 only in that a different shaped recess 51 is provided, in that an additional recess 55, rectangular in shape is provided, and in that only forty-four apertures 53 are provided in view of the recesses 51 and 55. Nine slots 52 are provided identical with the slots 42. The recess 51 has a rear wall 51' parallel to the longitudinal axis of the stiffening panel 5, a bottom side wall 51'' parallel to the transverse axis of the stiffening panel, and an oblique side wall 51''' diverging, with respect to the side wall 51'', towards the mouth of the recess, the angle of divergence $\beta$ being 10°.

The rectangular recess 55 has dimensions 15×56 millimeters and has its top edge (as seen in FIG. 6) spaced 27.3 millimeters from the top of the stiffening panel 5.

Turning now to the recess 51, the outermost end of the recess side wall 51''' is 135 millimeters from the top edge of the stiffening panel 5 and the recess side wall 51'' is 408 millimeters from the top edge. The recess 51 is 90 millimeters deep.

All other dimensions are the same as those given for the stiffening panel 4 and the material is again hardboard.

Figure 7:
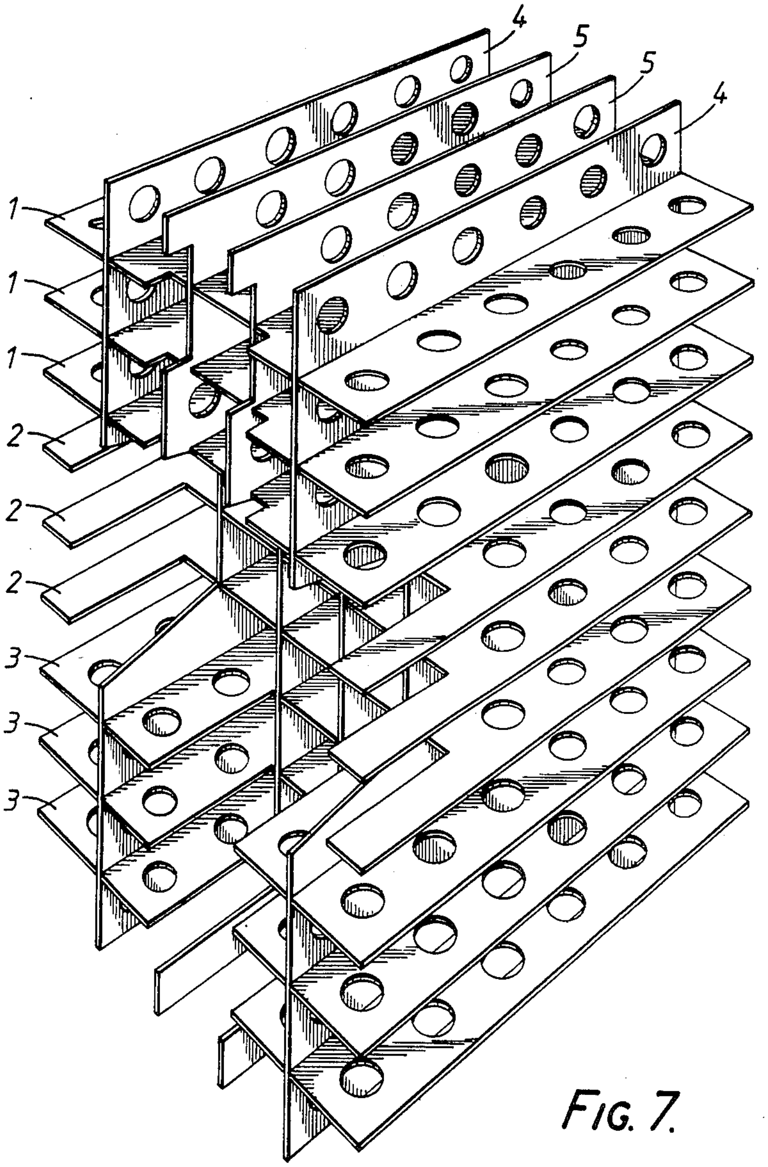
FIG. 7 is a perspective view of the various stiffening panels when assembled.
Figure 8:
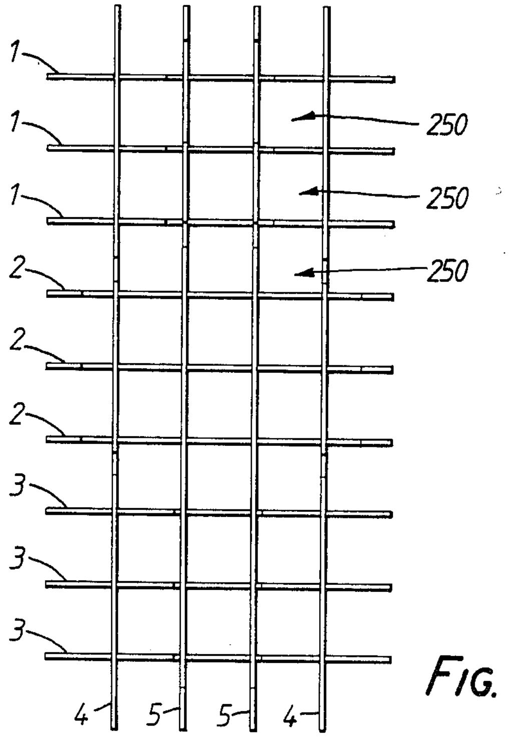
FIG. 8 is a front elevation of the assembly of stiffening panels shown in FIG. 7.

The thirteen stiffening panels just described are slotted together to form the composite structure of intersecting stiffening panels shown in FIG. 7 which constitutes the stiffening structure 200. At each intersection, the slot of a vertical stiffening panel accommodates the thickness of a horizontal stiffening panel up to the end of the slot and thereafter the slot of the horizontal stiffening panel accommodates the thickness of the vertical stiffening panel. The recesses 11, 21, 31, 41, 51 and 55 define spaces to accommodate the rear of each drive unit of the system and space in the vicinity of the vent.

Whilst it is possible to assemble the thirteen stiffening panels into the stiffening structure 200, using adhesive at the intersections, and then to introduce the completed structure into the housing 100, it is preferred that the stiffening panels 1 to 5 be slotted one at a time into matching grooves (not shown) provided in the housing walls. The stiffening panels 1, 2 and 3 can be inserted into the housing 100 with the front wall removed, rather like drawers being inserted into a chest of drawers, and thereafter the stiffening panels 4 and 5 can be slotted into place. The internal surfaces of the housing 100 and the cellular stiffening structure 200 may then, if desired, be sprayed with a vibration-deadening compound, such as, for example, liquid bitumastic, which may also serve as an adhesive effecting (if no other adhesive is used) or assisting the bonding of the intersecting stiffening panels to each other and to the walls of the housing 100.

Acoustically absorbent material in the form of a respective block 300 of synthetic resin foam is inserted into each of the cells 250 of the stiffening structure 200. The schematic assembly drawing shows, by means of shading, which of the fifty cells 250 receive a block of foam of size 42×42×250 millimeters and other cells (unshaded) into which a shorter block is inserted. The circle 310 in broken outline shows the position of the high frequency drive unit, the circle 320 shows the position of the main drive unit, and the circle 330 the position of the circular vent in the front panel of the housing 100. Nineteen of the cells 250 receive shorter foam blocks to leave a space free behind the rear face of the main drive unit and behind the circular vent. Those spaces are left since the acoustically absorbent material must not touch the cone of the main drive unit (the high frequency drive unit is of an enclosed construction and so does not need that precaution) and since free air movement must be allowed in the vicinity of the vent to avoid undue damping of the Helmholtz reasonance. The vent may be a simple circular opening or may include a short pipe, in either case a free space of about 50 to 100 millimeters should be left behind the inner end of the vent.

Figure 10:
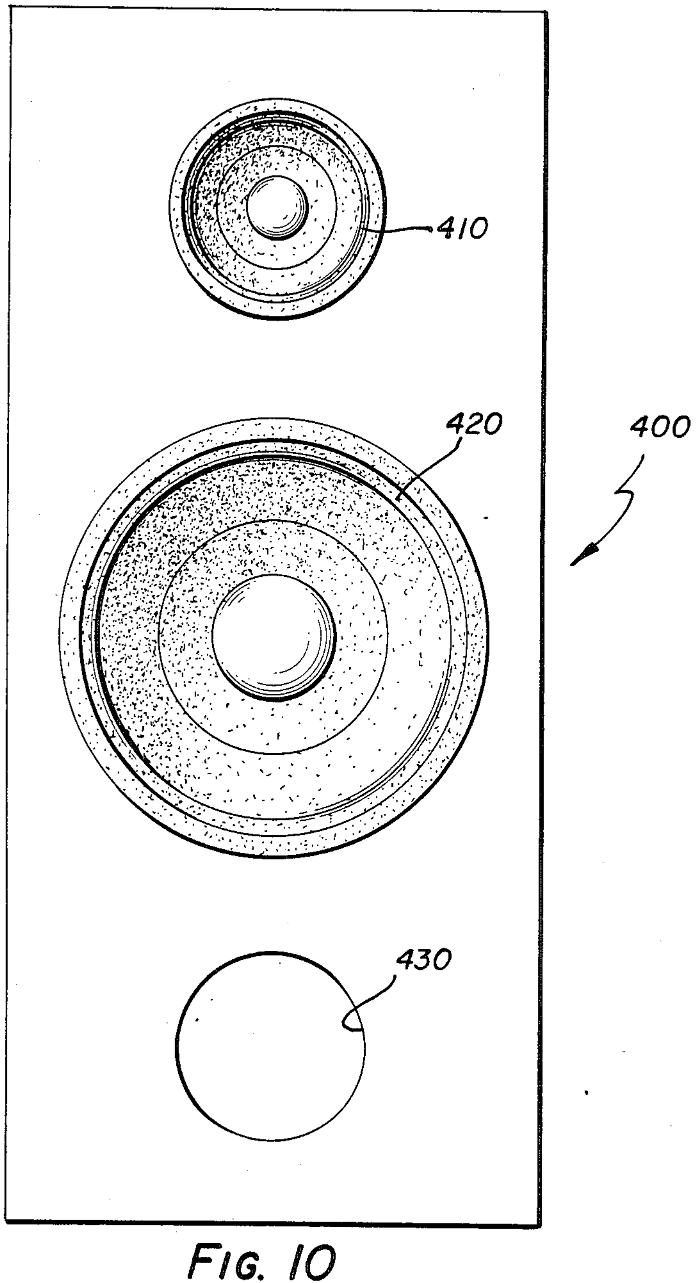
FIG. 10 is a diagrammatic view of the front panel of the loudspeaker enclosure.

FIG. 10 shows the front panel 400 of the loudspeaker enclosure with the high frequency drive unit 410 and the main drive unit 420 (corresponding to the circles 310 and 320, respectively, of FIG. 9) and a circular aperture 430 (corresponding to the circle 330 of FIG. 9) constituting the above-mentioned vent.

The acoustically absorbent material serves to reduce the amplitude of resonances within the individual cells, but care should be taken to avoid providing so much damping of pressure flutuations within the housing that the cone of the loudspeaker drive unit is damped to an extent that results in an unacceptably low output. The correct amount of acoustic absorbtion is essentially a compromise choice for any given size and shape of enclosure, and in some instances it may be preferred to leave some cells free of acoustically absorbent material.

The second enclosure according to the invention is identical to the first except that the vent is omitted and full length foam blocks are used in the cells that are in the vicinity of where the vent is in the first enclosure.

Instead of hardboard, the stiffening panels may be made of another suitable material, plywood being a preferred alternative.

The loudspeaker enclosures described with reference to the accompanying drawings may have a single loudspeaker drive unit or more than two such units instead of the two such units described.

The dimensions of the various components that are given above are merely examples of suitable dimensions, the invention being applicable to loudspeaker enclosures over a wide range of sizes. As is explained above, with large enclosures it will usually be found desirable to use a larger number of, and/or thicker, stiffening panels.

Although, throughout the Specification (including the claims), it is assumed that the principal sections of the loudspeaker housing are rectangular, and it is asserted that the stiffening panels of one set intersect the stiffening panels of the other set substantially orthogonally, it will be appreciated that the invention is not limited to a loudspeaker enclosure or a loudspeaker system of which the housing is of that configuration, and also that the stiffening panels do not necessarily have to intersect each other orthogonally or meet the housing walls orthogonally. It is to be expected, however, that the resulting stiffening structure will be more difficult to fabricate (leaving aside the case where the stiffening panels are made of a plastics material and the structure is of integral construction) and also, because at least some stiffening panels may extend between adjacent rather than opposite housing walls, that it may (although still affording a useful advantage over conventional enclosures) make a less marked improvement then it would if the stiffening panels were orthogonal to each other and to the housing walls.

I claim:

1. A loudspeaker enclosure comprising a rectangular box-like housing consisting of top and bottom walls, front and back walls, left and right side walls, each of the walls being formed by a wooden panel, a hollow stiffening structure located within the housing and extending from the top wall to the bottom wall, from the front wall to the back wall, and from the left side wall to the right side wall, the hollow stiffening structure comprising a first set of spaced-apart stiffening panels arranged with their planes substantially parallel to each other and substantially parallel to the walls of a pair of opposed housing walls, and a second set of spaced-apart stiffening panels arranged with their planes substantially parallel to each other and substantially parallel to the walls of a different pair of opposed housing walls, the stiffening panels of the first set being secured to the stiffening panels of the second set and intersecting them substantially orthogonally so that the stiffening panels, together with the housing walls, define a multiplicity of rectangular parallepipedal cells, holes being provided in the stiffening panels to provide communication between adjacent cells.

2. A loudspeaker enclosure as claimed in claim 1, wherein the stiffening panels of at least one of the said sets of stiffening panels are of integral construction and span the interior of the housing.

3. A loudspeaker enclosure as claimed in claim 2, wherein the stiffening panels of one of the said sets of stiffening panels are of integral construction and span the interior of the housing and the stiffening panels of the other of the said sets of stiffening panels are made up of strips of which some extend between, and are secured to, adjacent panels of the said one set and others extend between, and are secured to panels of the said one set and wall of the housing.

4. A loudspeaker enclosure as claimed in claim 2, wherein the stiffening panels of both of the said sets of stiffening panels are of integral construction and span the interior of the housing, each stiffening panel including slots, and the slots in the stiffening panels of each set receiving stiffening panels of the other set.

5. A loudspeaker enclosure as claimed in claim 1, wherein the stiffening panels are secured to the housing walls.

6. A loudspeaker enclosure as claimed in claim 5, wherein the stiffening panels are secured to the housing walls by means of adhesive.

7. A loudspeaker enclosure as claimed in claim 6, wherein the adhesive used is one that sets to a rubbery rather than a brittle condition.

8. A loudspeaker enclosure as claimed in claim 1, wherein edge portions of the stiffening panels are received in grooves in the housing walls.

9. A loudspeaker enclosure as claimed in claim 1, wherein the cells defined by the stiffening panels, together with the housing walls, are of substantially square cross-section.

10. A loudspeaker enclosure as claimed in claim 1, wherein each of the said sets of stiffening panels consists of at least three stiffening panels.

11. A loudspeaker enclosure as claimed in claim 10, wherein one of the said sets of stiffening panels consists of at least five stiffening panels.

12. A loudspeaker enclosure as claimed in claim 1, wherein the front wall of the enclosure is arranged to receive at least one loudspeaker drive unit and the stiffening panels of one set lie parallel to the side walls of the housing, and the stiffening panels of the other set lie parallel to the top and bottom walls of the housing.

13. A loudspeaker enclosure comprising a rectangular box-like housing consisting of top and bottom walls, front and back walls, left and right side walls, each of the walls being formed by a wooden panel, a hollow stiffening structure located within the housing and extending from the top wall to the bottom wall, from the front wall to the back wall, and from the left side wall to the right side wall, the hollow stiffening structure comprising a first set of spaced-apart wooden stiffening panels arranged with their planes substantially parallel to each other and substantially parallel to the walls of a pair of opposed housing walls, and a second set of spaced-apart wooden stiffening panels arranged with their planes substantially parallel to each other and substantially parallel to the walls of a different pair of opposed housing walls, the wooden stiffening panels of the first set being secured to the wooden stiffening panels of the second set and intersecting them substantially orthogonally so that the wooden stiffening panels, together with the housing walls, define a multiplicity of rectangular parallepipedal cells, holes being provided in the wooden stiffening panels to provide communication between adjacent cells.

14. A loudspeaker enclosure as claimed in claim 13, wherein the stiffening panels are made of hardboard.

15. A loudspeaker enclosure as claimed in claim 13, wherein the stiffening panels are made of plywood.

16. A loudspeaker enclosure as claimed in claim 13, wherein the stiffening panels of one set are secured to the stiffening panels of the other set.

17. A loudspeaker enclosure as claimed in claim 16, wherein the stiffening panel of one set are secured to the stiffening panels of the other set by means of adhesive.

18. A loudspeaker enclosure as claimed in claim 17, wherein the adhesive used is one that sets to a rubbery, rather than a brittle condition.

19. A loudspeaker enclosure comprising a rectangular box-like housing consisting of top and bottom walls, front and back walls, left and right side walls, each of the walls being formed by a wooden panel, a hollow stiffening structure located within the housing and extending from the top wall to the bottom wall, from the front wall to the back wall, and from the left side wall to the right side wall, the hollow stiffening structure comprising a first set of spaced-apart stiffening panels arranged with their planes substantially parallel to each other and substantially parallel to the walls of a pair of opposed housing walls, and a second set of spaced-apart stiffening panels arranged with their planes substantially parallel to each other and substantially parallel to the walls of a different pair of opposed housing walls, the stiffening panels of the first set being secured to the stiffening panels of the second set and intersecting them substantially orthogonally so that the stiffening panels, together with the housing walls, define a multiplicity of rectangular parallepipedal cells, holes being provided in the stiffening panels to provide communication between adjacent cells and at least the majority of the said cells containing acoustically absorbent material.

20. A loudspeaker enclosure as claimed in claim 19, wherein the acoustically absorbent material is in the form of blocks of open-cell plastics material.

21. A loudspeaker enclosure as claimed in claim 19 wherein the acoustically absorbent material is in the form of blocks of open-cell polyester foam or open-cell polyether foam.

22. A loudspeaker enclosure as claimed in claim 19 wherein the acoustically absorbent material is selected from the group consisting of bonded acoustic fibre, waste wool, rockwool or fibreglass.

23. A loudspeaker system comprising:

a loudspeaker enclosure having a rectangular box-like housing consisting of top and bottom walls, front and back walls, left and right side walls, each of the walls being formed by a wooden panel, and a hollow stiffening structure located within the housing and extending from the top wall to the bottom wall, from the front wall to the back wall, and from the left side wall to the right side wall, the hollow stiffening structure comprising a first set of spaced apart stiffening panels arranged with their planes substantially parallel to each other and substantially parallel to the walls of a pair of opposed housing walls, and a second set of spaced-apart stiffening panels arranged with their planes substantially parallel to each other and substantially parallel to the walls of a different pair of opposed housing walls, the stiffening panels of the first set being secured to the stiffening panels of the second set and intersecting them substantially orthogonally so that the stiffening panels, together with the housing walls, define a multiplicity of rectangular parallepipedal cells, holes being provided in the stiffening panels to provide communication between adjacent cells; and a loudspeaker drive unit mounted in one of said walls of the housing.

24. A loudspeaker enclosure as claimed in claim 23, wherein the stiffening structure and the inner surfaces of at least those housing walls that do not include a drive unit or drive units, are sprayed with a sound-deadening substance.

25. A loudspeaker system as claimed in claim 23, wherein a wall of the housing having mounted in it one or more loudspeaker drive units is also provided with a vent so that the loudspeaker enclosure constitutes a Helmholtz resonator.

* * * * *

UNITED STATES PATENT AND TRADEMARK OFFICE
CERTIFICATE OF CORRECTION

PATENT NO. : 4,690,244

DATED : September 1, 1987

INVENTOR(S) : Laurence G. Dickie

It is certified that error appears in the above-identified patent and that said Letters Patent is hereby corrected as shown below:

In the Specification

Column 2,line 14, "stiffnes" should be --stiffness--.

Column 2, line 64, "the the" should be --the--.

Column 5, line 44, "enclosures" should be --enclosure--.

Column 9, line 61, "reasonance" should be --resonance--.

Column 10, line 7, "flutuations" should be --fluctuations--.

In the Claims

Column 12, line 49, after "19" insert --,--.

Column 12, line 53, after "19" insert --,--.

In the Abstract

Line 20, "the" , first occurrence, should read -- them --.

Line 19, delete "pg,2".

Signed and Sealed this

Second Day of February, 1988

*Attest:*

DONALD J. QUIGG

*Attesting Officer*

*Commissioner of Patents and Trademarks*